(12) United States Patent
Jiang et al.

(10) Patent No.: US 12,125,870 B2
(45) Date of Patent: Oct. 22, 2024

(54) STRETCHABLE DISPLAY PANEL

(71) Applicant: Au Optronics Corporation, Hsinchu (TW)

(72) Inventors: Cheng-Wei Jiang, Hsinchu (TW); Yi-Da He, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 393 days.

(21) Appl. No.: 17/702,809

(22) Filed: Mar. 24, 2022

(65) Prior Publication Data

US 2023/0140381 A1   May 4, 2023

(30) Foreign Application Priority Data

Oct. 28, 2021 (TW) ................................ 110140136

(51) Int. Cl.
| | |
|---|---|
| *H01L 27/15* | (2006.01) |
| *G09F 9/30* | (2006.01) |
| *G09F 9/33* | (2006.01) |
| *H01L 33/62* | (2010.01) |

(52) U.S. Cl.
CPC ............ *H01L 27/156* (2013.01); *G09F 9/301* (2013.01); *G09F 9/33* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2008/0157235 A1* | 7/2008 | Rogers ................ | H01L 21/8258 257/415 |
| 2018/0046221 A1* | 2/2018 | Choi ...................... | H05B 33/22 |
| 2020/0373333 A1 | 11/2020 | Liang et al. | |

FOREIGN PATENT DOCUMENTS

| | | | | |
|---|---|---|---|---|
| CN | 108389884 | | 8/2018 | |
| CN | 111490053 | | 8/2020 | |
| CN | 108389884 B | * | 11/2020 | ............. H01L 27/10 |

\* cited by examiner

*Primary Examiner* — Yara B Green
*Assistant Examiner* — Tessa Elizabeth McNamee
(74) *Attorney, Agent, or Firm* — JCIPRNET (57) ABSTRACT

A stretchable display panel includes a first stretchable film, a first transparent optical clear adhesive, a patterned organic layer, multiple light-emitting elements, and multiple wires. The first transparent optical clear adhesive is located on the first stretchable film. The patterned organic layer includes multiple first island portions and multiple first bridge portions. Any adjacent two of the first island portions are connected via a corresponding one of the first bridge portions. The light-emitting elements are located above the first island portions. The first transparent optical clear adhesive is located between the light-emitting elements and the first stretchable film. A first surface of the patterned organic layer faces away from the light-emitting elements. An included angle between the first surface and a first side surface of the first island portions is greater than 90 degrees. The wires are located above the first bridge portions.

18 Claims, 9 Drawing Sheets

FIG. 5

STRETCHABLE DISPLAY PANEL

CROSS-REFERENCE TO RELATED APPLICATION

This application claims the priority benefit of Taiwan application serial no. 110140136 filed on Oct. 28, 2021. The entirety of the above-mentioned patent application is hereby incorporated by reference herein and made a part of this specification.

BACKGROUND

Technical Field

The disclosure relates to a stretchable display panel.

Description of Related Art

With the increasing development of electronic technology, electronic products are constantly innovating. In order to apply electronic products in various fields, more and more attention has gradually been placed on the characteristics of stretchability, thinness, and design flexibility. That is, there has been an increasing demand that electronic products exhibit different appearances according to different applications and environments. To cope with such demand, electronic products need to be stretchable. For example, a stretchable display device may be integrated onto a spherical surface, thereby obtaining a spherical display device.

SUMMARY

The disclosure provides a stretchable display panel capable of reducing breakage after stretching.

At least one embodiment of the disclosure provides a stretchable display panel. The stretchable display panel includes a first stretchable film, a first transparent optical clear adhesive, a patterned organic layer, multiple light-emitting elements, and multiple wires. The first transparent optical clear adhesive is located on the first stretchable film. The patterned organic layer includes multiple first island portions and multiple first bridge portions. Adjacent first island portions of the first island portions are connected via a corresponding first bridge portion of the first bridge portions. The light-emitting elements are located above the first island portions. The first transparent optical clear adhesive is located between the light-emitting elements and the first stretchable film. The first surface of the patterned organic layer faces away from the light-emitting elements. An included angle between the first surface and the first side surface of the first island portions is greater than 90 degrees. The wires are located above the first bridge portions.

To make the aforementioned more comprehensible, several embodiments accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
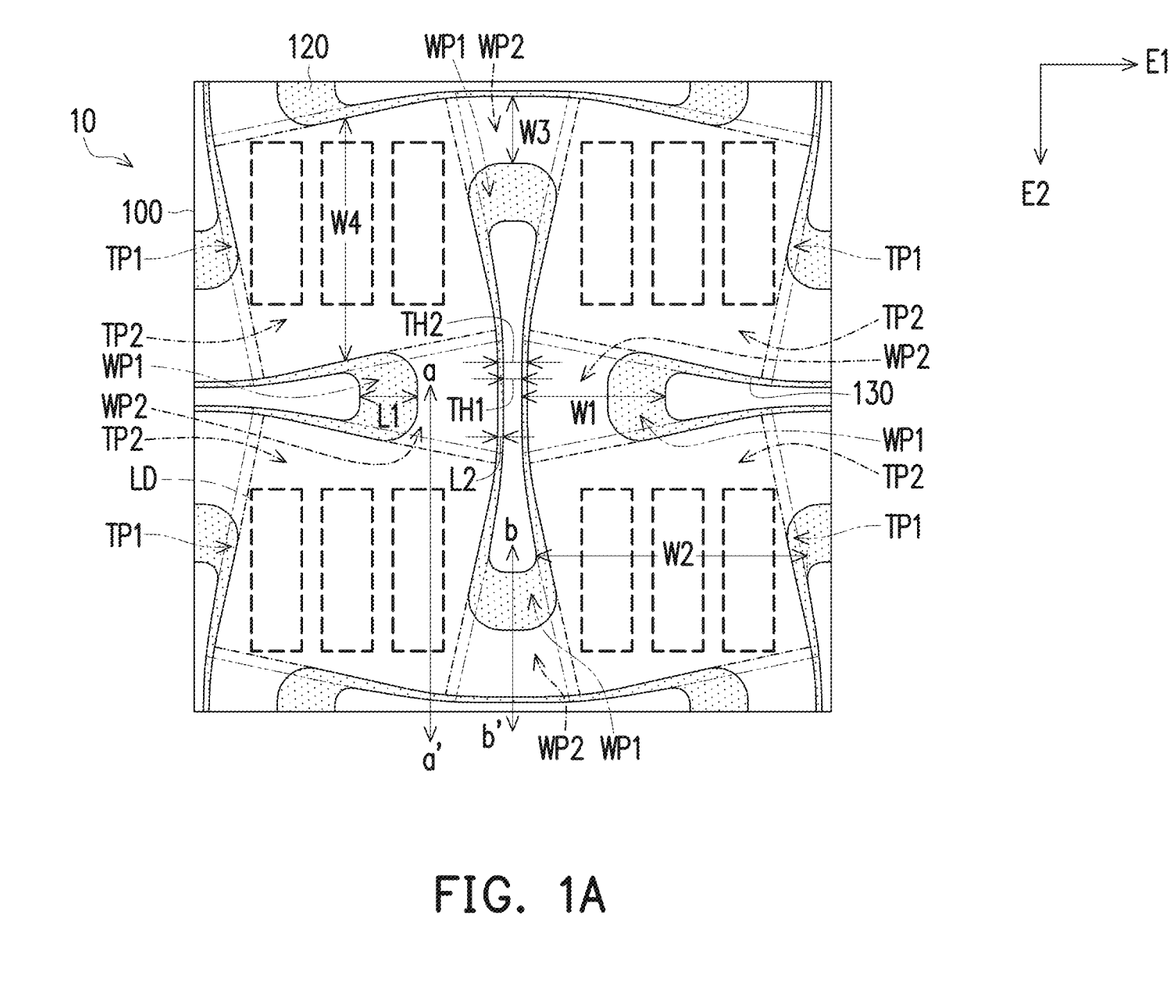
FIG. 1A and FIG. 1B are partial top schematic views of a stretchable display panel according to an embodiment of the disclosure.
Figure 1B:
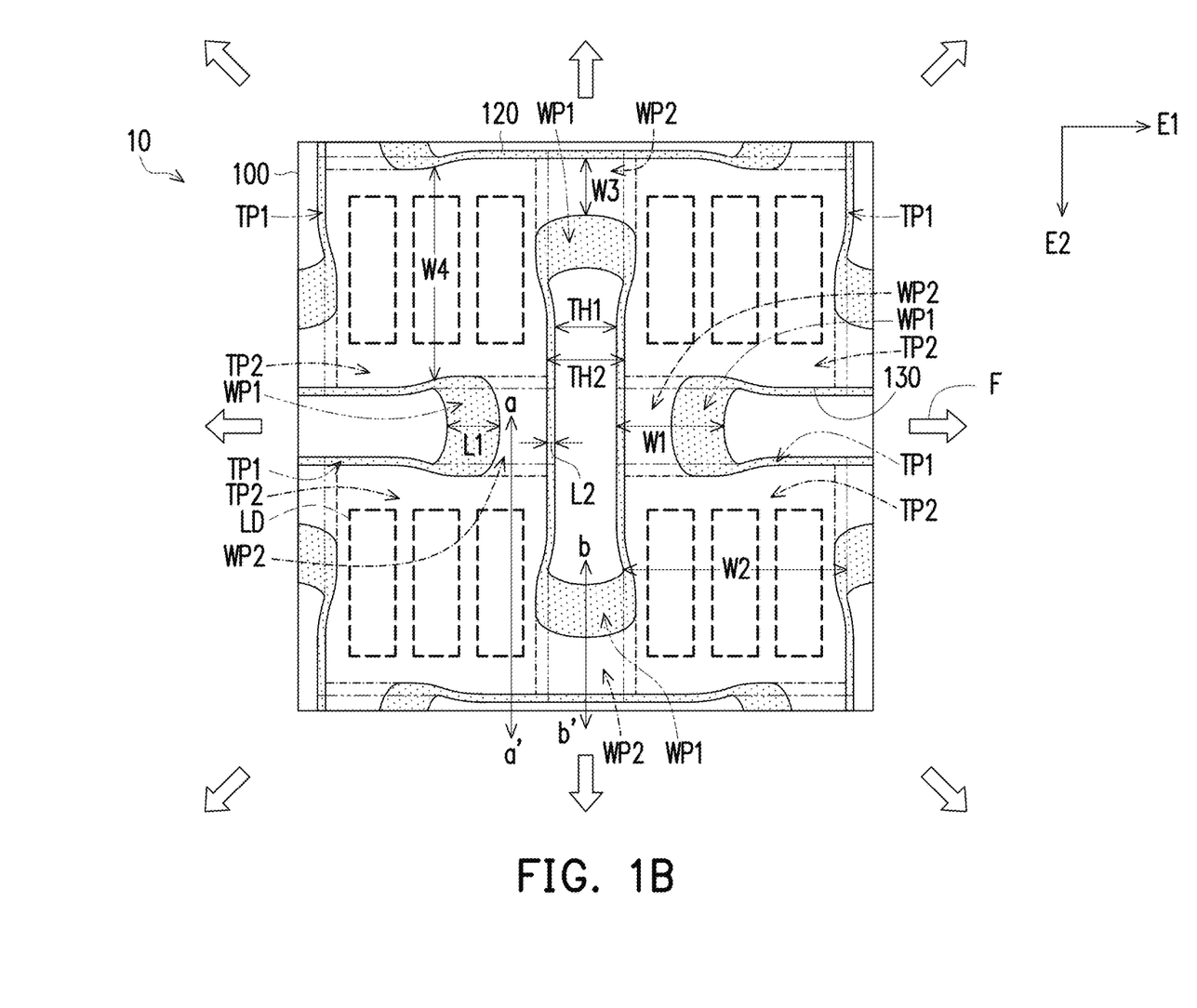
Figure 2A:
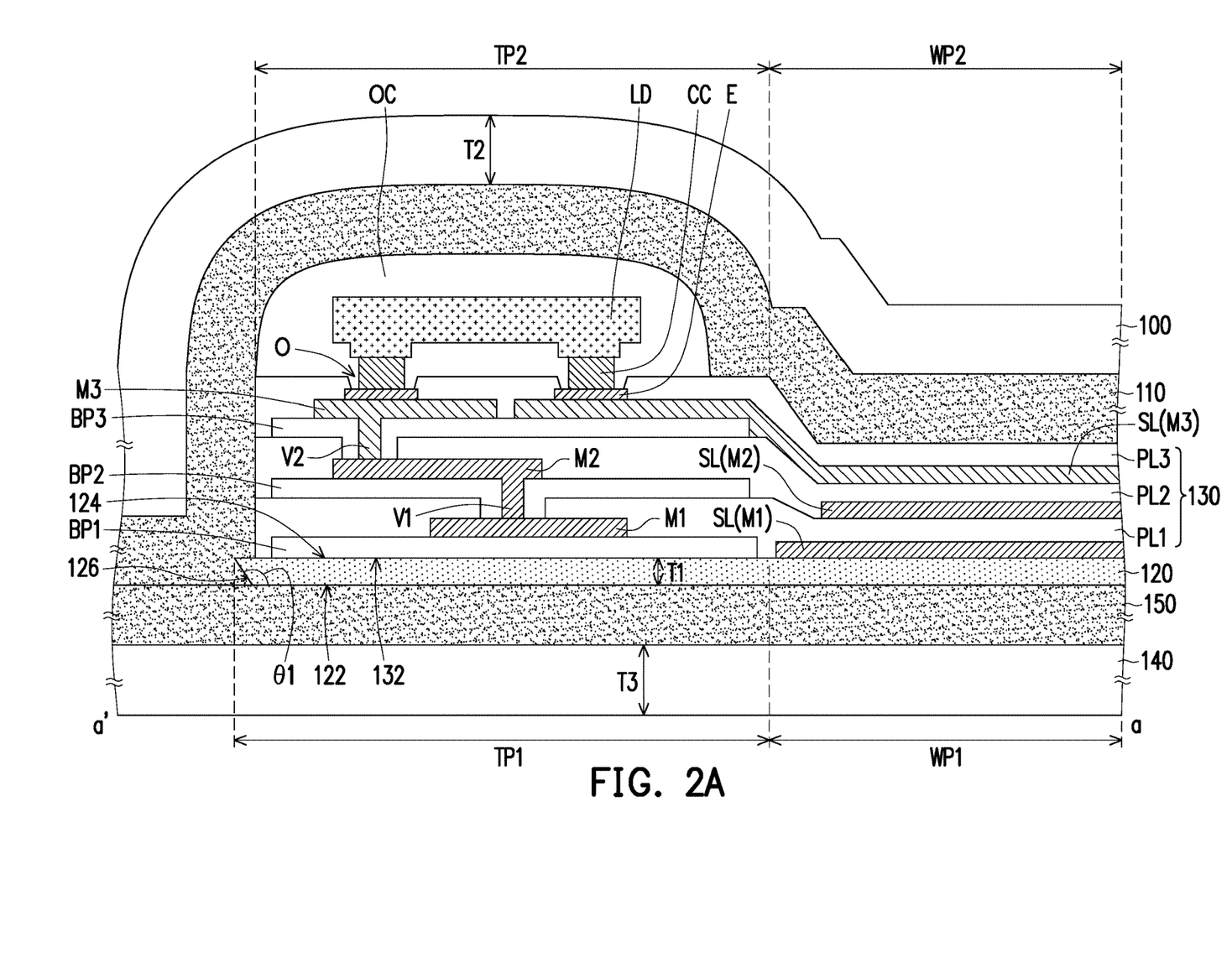
FIG. 2A is a cross-sectional schematic view along a line a-a' of FIG. 1A.
Figure 2B:
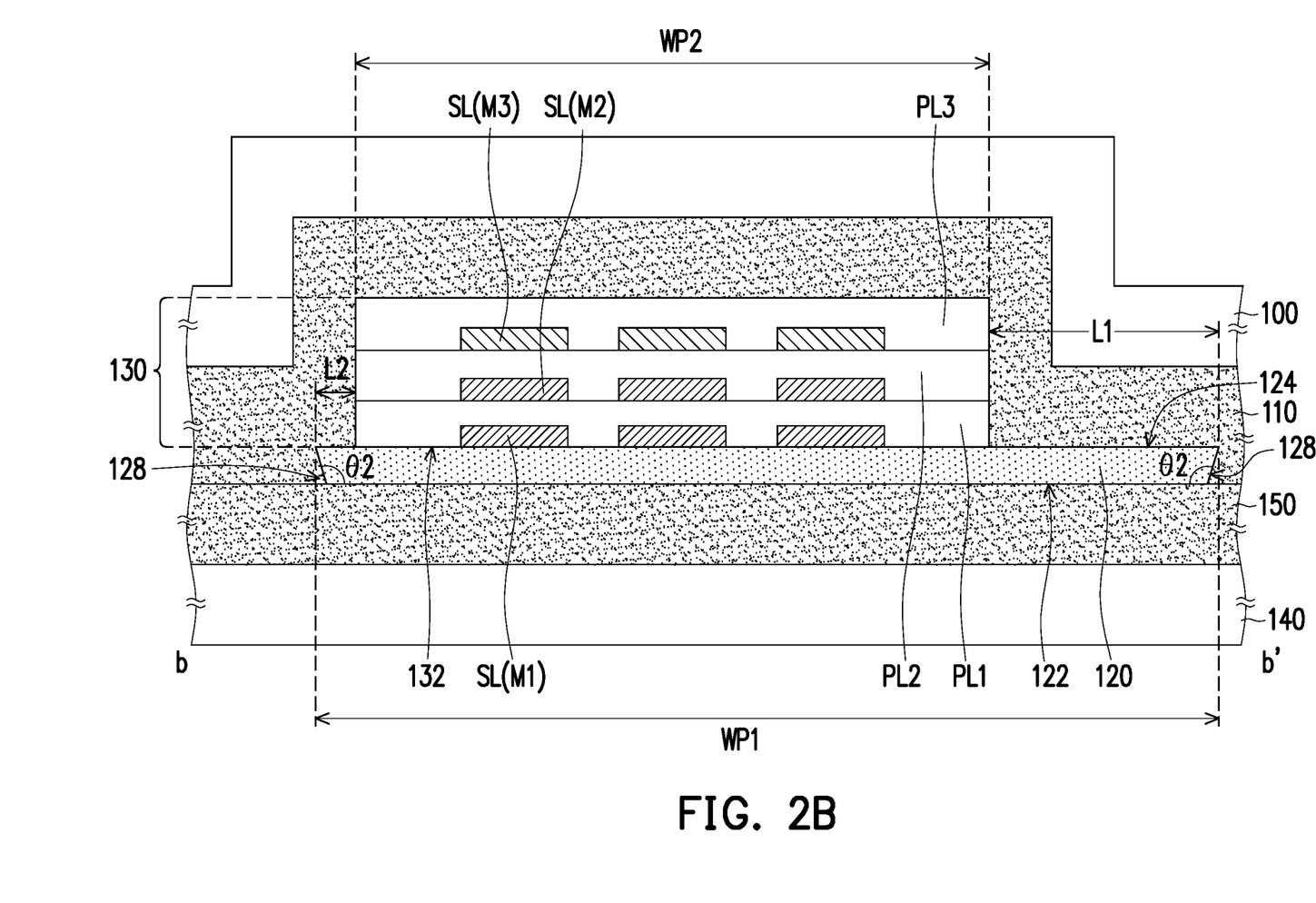
FIG. 2B is a cross-sectional schematic view along a line b-b' of FIG. 1A.

FIG. 1A and FIG. 1B are partial top schematic views of a stretchable display panel according to an embodiment of the disclosure. Specifically, FIG. 1B illustrates a state in which the stretchable display panel of FIG. 1A is stretched along a direction of an arrow F. FIG. 2A is a cross-sectional schematic view along a line a-a' of FIG. 1A. FIG. 2B is a cross-sectional schematic view along a line b-b' of FIG. 1A. FIG. 1A and FIG. 1B illustrate a first stretchable film 100, a patterned organic layer 120, a patterned insulating structure 130, and a light-emitting element LD, and other components are omitted and not shown.

Referring to FIG. 1A, FIG. 1B, FIG. 2A and FIG. 2B, a stretchable display panel 10 includes the first stretchable film 100, a first transparent optical clear adhesive 110, the patterned organic layer 120, multiple light-emitting elements LD, and multiple wires SL. In this embodiment, the stretchable display panel 10 further includes a patterned insulating structure 130, a second stretchable film 140, a second transparent optical clear adhesive 150, and a cover layer OC.

The patterned organic layer 120 includes multiple first island portions TP1 and multiple first bridge portions WP1. The adjacent first island portions TP1 are connected via the corresponding first bridge portion WP1. A width W1 of each of the first bridge portions WP1 is smaller than a width W2 of each of the first island portions TP1. In the embodiment of FIG. 1A, the width W1 of the first bridge portion WP1 is parallel to a side of the light-emitting element LD. In the embodiment of FIG. 1A, the width W2 of the first island portion TP1 is parallel to the side of the light-emitting element LD. The first island portions TP1 are arranged into an array along a first direction E1 and a second direction E2. In at least some of the first bridge portions WP1, two ends of the first bridge portion WP1 are respectively connected to two corresponding first island portions TP1. At least two of the first island portions TP1 are separated by a through hole TH1. In this embodiment, each of the through holes TH1 is surrounded by corresponding four first island portions TP1 and corresponding four first bridge portions WP1. In this embodiment, the through hole TH1 of the patterned organic layer 120 is dumbbell-shaped, some of the through holes TH1 extend along the first direction E1, and other through holes TH1 extend along the second direction E2. The through holes TH1 extending along the first direction E1 and the other through holes TH1 extending along the second direction E2 are alternately arranged, thereby facilitating the stretchability of the stretchable display panel 10.

In some embodiments, the material of the patterned organic layer 120 includes polyimide (PI), polyethylene naphthalate (PEN), polyethylene terephthalate (PET), polycarbonates (PC), polyether sulfone (PES), or polyarylate, or a combination thereof, or other suitable materials. In some embodiments, the patterned organic layer 120 may include a material that can withstand the temperature of a thin film transistor manufacturing process. In some embodiments, a thickness T1 of the patterned organic layer 120 is 0.5 μm to 10 μm.

The patterned insulating structure 130 is located on the patterned organic layer 120. In this embodiment, the patterned insulating structure 130 includes a first insulating layer PL1, a second insulating layer PL2, and a third insulating layer PL3, and optionally includes a first buffer layer BP1, a second buffer layer BP2, and a third buffer layer BP3.

The first insulating layer PL1 is located above the patterned organic layer 120. In some embodiments, the first buffer layer BP1 is optionally provided between the first insulating layer PL1 and the patterned organic layer 120.

The second insulating layer PL2 is located above the first insulating layer PL1. In some embodiments, the second buffer layer BP2 is optionally provided between the second insulating layer PL2 and the first insulating layer PL1.

The third insulating layer PL3 is located above the second insulating layer PL2. In some embodiments, a third buffer layer BP3 is optionally provided between the third insulating layer PL3 and the second insulating layer PL2.

In some embodiments, the patterned insulating structure 130 includes organic and inorganic insulating materials. The forming method of the patterned insulating structure 130 includes a lithography process and an etching process. For example, the first insulating layer PL1, the second insulating layer PL2, and the third insulating layer PL3 all include a cured photoresist material, and the first buffer layer BP1, the second buffer layer BP2, and the third buffer layer BP3 include a cured photoresist material or an inorganic material that is patterned through etching. In other words, the patterned insulating structure 130 includes a stack of multiple cured photoresist layers and multiple inorganic layers.

In this embodiment, the patterned insulating structure 130 includes multiple second island portions TP2 and multiple second bridge portions WP2. The adjacent second island portions TP2 are connected via the corresponding second bridge portion WP2. A width W3 of each of the second bridge portions WP2 is smaller than a width W4 of each of the second island portions TP2. In the embodiment of FIG. 1A, the width W3 of the second bridge portion WP2 is parallel to a side of the light-emitting element LD. In the embodiment of FIG. 1A, the width W4 of the second island portion TP2 is parallel to the side of the light-emitting element LD. The second island portions TP2 are arranged into an array along the first direction E1 and the second direction E2. In at least some of the second bridge portions WP2, two ends of the second bridge portion WP2 are respectively connected to two corresponding second island portions TP2. At least two of the second island portions TP2 are separated by a through hole TH2. In this embodiment, each of the through holes TH2 is surrounded by corresponding four second island portions TP2 and corresponding four second bridge portions WP2. In this embodiment, the through hole TH2 of the patterned insulating structure 130 is dumbbell-shaped, some of the through holes TH2 extend along the first direction E1, and other through holes TH2 extend along the second direction E2. The through holes TH2 extending along the first direction E1 and the other through holes TH2 extending along the second direction E2 are alternately arranged, thereby facilitating the stretchability of the stretchable display panel 10. In this embodiment, the through hole TH2 of the patterned insulating structure 130 overlaps the through hole TH1 of the patterned organic layer 120, and the size of the through hole TH2 of the patterned insulating structure 130 is larger than that of the through hole TH1 of the patterned organic layer 120. In other words, the area of an orthogonal projection of the patterned insulating structure 130 is smaller than the area of an orthogonal projection of the patterned organic layer 120.

In this embodiment, the first insulating layer PL1, the first buffer layer BP1, the second insulating layer PL2, the second buffer layer BP2, the third insulating layer PL3, and the third buffer layer BP3 of the patterned insulating structure 130 are located at the second island portion TP2, and the first insulating layer PL1, the first buffer layer BP1, the second insulating layer PL2, the second buffer layer BP2, the third insulating layer PL3, and the third buffer layer BP3 optionally extend into the second bridge portion WP2. In some embodiments, a thickness of the second bridge portion WP2 is smaller than a thickness of the second island portion TP2. For example, the second island portion TP2 includes a greater number of insulating layers and/or a greater number of buffer layers than the insulating layers and/or the buffer layers of the second bridge portion WP2, but the disclosure is not limited thereto. In this embodiment, the second island portion TP2 includes multiple inorganic insulating layers (i.e., the first buffer layer BP1, the second buffer layer BP2, and the third buffer layer BP3), and the inorganic insulating layers do not extend into the second bridge portion WP2 (i.e., the second bridge portion WP2 does not include the first buffer layer BP1, the second buffer layer BP2, and the third buffer layer BP3). Accordingly, the breakage of the second bridge portion WP2 after stretching can be reduced.

In this embodiment, the patterned organic layer 120 has a first surface 122 and a second surface 124, and the first surface 122 is opposite to the second surface 124. The second surface 124 of the patterned organic layer 120 faces toward the patterned insulating structure 130. In some embodiments, the area of a bottom surface 132 of the patterned insulating structure 130 contacting the patterned organic layer 120 is smaller than the area of the second surface 124 of the patterned organic layer 120 facing toward the patterned insulating structure 130. In this embodiment, a width of the second bridge portion WP2 is smaller than a width of the first bridge portion WP1. In some embodiments, each of the second bridge portions WP2 is located on a corresponding first bridge portion WP1, and a side surface of each of the second bridge portions WP2 deviates from a side surface of the corresponding first bridge portion WP1. Specifically, a distance L1 between the second bridge portion WP2 and a side surface of the first bridge portion WP1 is greater than a distance L2 between the second bridge portion WP2 and another side surface of the first bridge portion WP1. In the embodiment of FIG. 1A, the distance L1 and the distance L2 are parallel to the side of the light-emitting element LD. With the second bridge portion WP2 arranged deflectively above the first bridge portion WP1, stress concentration which leads to breakage of the wire SL in the second bridge portion WP2 can be avoided. Although in this embodiment, the second bridge portion WP2 is arranged deflectively above the first bridge portion WP1, the disclosure is not limited thereto. In other embodiments, the second bridge portion WP2 may also be arranged to be aligned to the center the first bridge portion WP1. In other words, the distance L1 may be optionally equal to the distance L2.

A first conductive layer M1, a second conductive layer M2, and a third conductive layer M3 are located in the patterned insulating structure 130. In this embodiment, the first conductive layer M1 is located above the patterned organic layer 120 and is optionally located above the first buffer layer BP1. The second conductive layer M2 is located above the first insulating layer PL1 and is optionally located above the second buffer layer BP2, and the second conductive layer M2 is optionally electrically connected to the first conductive layer M1. For example, a portion of the second conductive layer M2 is electrically connected to the first conductive layer M1 through a conductive via V1 in the first insulating layer PL1. The second conductive layer M2 and the conductive via V1 are formed together, for example. The third conductive layer M3 is located above the second insulating layer PL2 and is optionally located above the third buffer layer BP3, and the third conductive layer M3 is optionally electrically connected to the second conductive layer M2. For example, a portion of the third conductive layer M3 is electrically connected to the second conductive layer M2 through a conductive via V2 in the second insulating layer PL2. The third conductive layer M3 and the conductive via V2 are formed together, for example.

In this embodiment, at least one of the first conductive layer M1, the second conductive layer M2, and the third conductive layer M3 includes the wire SL. The wire SL is located above the first bridge portion WP1 of the patterned organic layer 120, and located in the second bridge portion WP2 of the patterned insulating structure 130. In some embodiments, some or all of the wires SL extend from the second bridge portion WP2 of the patterned insulating structure 130 into the second island portion TP2. In other words, the wire SL extends from the above of the first bridge portion WP1 into above of the first island portion TP1.

In this embodiment, the first conductive layer M1, the second conductive layer M2, and the third conductive layer M3 all include the wires SL, and some of the wires SL (the wire SL of the first conductive layer M1) directly contact the patterned organic layer 120.

In this embodiment, openings O of the third insulating layer PL3 overlap the third conductive layer M3. In other words, the openings O expose portions of the third conductive layer M3. Multiple electrodes E are formed in the openings O and cover the third conductive layer M3 at the bottom of the openings O. In some embodiments, the electrode E includes a metal oxide, such as indium tin oxide, but the disclosure is not limited thereto. The electrode E may include other conductive materials suitable for protecting the portion of the third conductive layer M3 exposed by the opening O.

The light-emitting element LD is located above the first island portion TP1. The first surface 122 of the patterned organic layer 120 faces away from the light-emitting element LD. In this embodiment, the light-emitting element LD is located above the second island portion TP2 and is electrically connected to the electrode E through a conductive connection structure CC. In some embodiments, the conductive connection structure CC includes, for example, indium, tin, bismuth, conductive paste, a combination thereof, or other suitable materials. In some embodiments, the light-emitting element LD is placed on the electrode E by a bulk transfer process. The light-emitting element LD is electrically connected to the third conductive layer M3 through the electrode E, and is further electrically connected to the wire SL located in the second bridge portion WP2 of the third conductive layer M3, the second conductive layer M2, and/or the first conductive layer M1. In some embodiments, the light-emitting element LD includes an organic light-emitting diode, a micro light-emitting diode, or other light-emitting element. The light-emitting element LD is electrically connected to the electrodes E through, for example, eutectic bonding, conductive adhesive bonding, welding, or other similar processes. In this embodiment, light-emitting elements LD of different colors are disposed above the respective second island portions TP2 to form color pixels. For example, a red display element, a green display element, and a blue display element are disposed above the respective second island portions TP2.

In this embodiment, multiple cover layers OC are located on the second island portions TP2, and each of the cover layers OC is located on a corresponding second island portion TP2. The cover layer OC covers and envelops the corresponding light-emitting element LD. The cover layer OC is, for example, a transparent optical clear adhesive (or transparent packing adhesive), and is suitable for protecting the light-emitting element LD. In some embodiments, a process for forming the cover layer OC includes ink jet printing or other suitable processes.

In some embodiments, the material of the first stretchable film 100 includes a thermoplastic polymer, such as thermoplastic polyurethane (TPU), silicone, epoxy, or other suitable materials. In some embodiments, a thickness T2 of the first stretchable film 100 is 50 μm to 1000 μm.

The first transparent optical clear adhesive 110 is located on the first stretchable film 100. The first transparent optical clear adhesive 110 is located between the light-emitting element LD and the first stretchable film 100. In this embodiment, the first transparent optical clear adhesive 110 contacts the cover layer OC, and the first transparent optical clear adhesive 110 optionally contacts the second island portion TP2 and the second bridge portion WP2 of the patterned insulating structure 130. In some embodiments, the first transparent optical clear adhesive 110 is formed on the entire surface of the first stretchable film 100.

In some embodiments, the first transparent optical clear adhesive 110 is an optical clear adhesive, acrylic adhesive, UV curable adhesive, or other suitable adhesive materials. In some embodiments, the thickness of the first transparent optical clear adhesive 110 is 10 μm or more.

In some embodiments, the first stretchable film 100 and the first transparent optical clear adhesive 110 are in a structure with a full surface without holes. In other words, the first stretchable film 100 and the first transparent optical clear adhesive 110 overlap the through hole TH1 of the patterned organic layer 120 and the through hole TH2 of the patterned insulating structure 130. In other embodiments, the first stretchable film 100 and the first transparent optical clear adhesive 110 may have a mesh structure. With the mesh structure, the stretchability of the first stretchable film 100 and the first transparent optical clear adhesive 110 can be further facilitated.

In this embodiment, an included angle θ1 between the first surface 122 of the patterned organic layer 120 and a first side surface 126 of the first island portion TP1 is greater than 90 degrees, as shown in FIG. 2A. In this embodiment, the included angle θ1 between each side surface of the first island portion TP1 and the first surface 122 is greater than 90 degrees. In some embodiments, an included angle θ2 between the first surface 122 of the patterned organic layer 120 and a second side surface 128 of the first bridge portion WP1 is greater than 90 degrees, as shown in FIG. 2B. In this embodiment, the included angle θ2 between each side surface of the first bridge portion WP1 and the first surface 122 is greater than 90 degrees. Since the included angle θ1 and the included angle θ2 are greater than 90 degrees, the area of the second surface 124 of the patterned organic layer 120 close to the light-emitting element LD is larger than the area of the first surface 122 of the patterned organic layer 120 facing away from the light-emitting element LD.

In this embodiment, by setting the included angle θ1 and the included angle θ2, the patterned organic layer 120 can be more easily taken off from a temporary substrate (not shown in FIG. 1A, FIG. 2A, and FIG. 2B). The description of the temporary substrate is described in the following embodiments.

In some embodiments, the material of the second stretchable film 140 includes a thermoplastic polymer, such as thermoplastic polyurethane (TPU), silicone, epoxy, or other suitable materials. The material of the second stretchable film 140 and the material of the first stretchable film 100 may be the same as or different from each other. In some embodiments, a thickness T3 of the second stretchable film 140 is 50 μm to 1000 μm.

The second transparent optical clear adhesive 150 is located on the second stretchable film 140. The second transparent optical clear adhesive 150 is located between the patterned organic layer 120 and the second stretchable film 140. In this embodiment, the second transparent optical clear adhesive 150 contacts the first surface 122 of the patterned organic layer 120. In some embodiments, the entire surface of the second transparent optical clear adhesive 150 is formed on the second stretchable film 140.

In some embodiments, the second transparent optical clear adhesive 150 is an optical clear adhesive, acrylic adhesive, UV curable adhesive, or other suitable adhesive materials. In some embodiments, the thickness of the second transparent optical clear adhesive 150 is 10 μm to 1000 μm. The thickness of the first transparent optical clear adhesive 110 and the thickness of the second transparent optical clear adhesive 150 may be the same as or different from each other.

In some embodiments, the second stretchable film 140 and the second transparent optical clear adhesive 150 are in a structure with a full surface without holes. In other words, the second stretchable film 140 and the second transparent optical clear adhesive 150 overlap the through hole TH1 of the patterned organic layer 120 and the through hole TH2 of the patterned insulating structure 130. In other embodiments, the second stretchable film 140 and the second transparent optical clear adhesive 150 may have a mesh structure. With such a mesh structure, the stretchability of the second stretchable film 140 and the second transparent optical clear adhesive 150 can be facilitated. In some embodiments, the second transparent optical clear adhesive 150 and the first transparent optical clear adhesive 110 are connected to or separated from each other in the through hole TH1 of the patterned organic layer 120. For example, as shown in FIG. 2A and FIG. 2B, the first transparent optical clear adhesive 110 fills into the through hole TH1 and contacts the second transparent optical clear adhesive 150. In other embodiments, the first transparent optical clear adhesive 110 does not fill into the through hole TH1 of the patterned organic layer 120, the second transparent optical clear adhesive 150 and the first transparent optical clear adhesive 110 are separated from each other, and an air gap is present between the second transparent optical clear adhesive 150 and the first transparent optical clear adhesive 110.

FIG. 3A to FIG. 3G are cross-sectional schematic views of a manufacturing method of a stretchable display panel according to an embodiment of the disclosure. It is noted here that the element reference numerals and a portion of the contents of the embodiments of FIG. 1A, FIG. 2A, and FIG. 2B are used in the embodiment of FIG. 3A to FIG. 3E, the same or similar reference numerals are used to denote the same or similar elements, and the description of the same technical content is omitted. For the description of the omitted portion, reference may be made to the above embodiment, and details are not described herein. FIG. 3A to FIG. 3G illustrate one of the through holes TH1 and one of the through holes TH2 of the stretchable display panel as an example, but in practice, the patterned insulating structure 130 of the stretchable display panel may include multiple through holes TH1 and multiple through holes TH2.

Figure 3A:
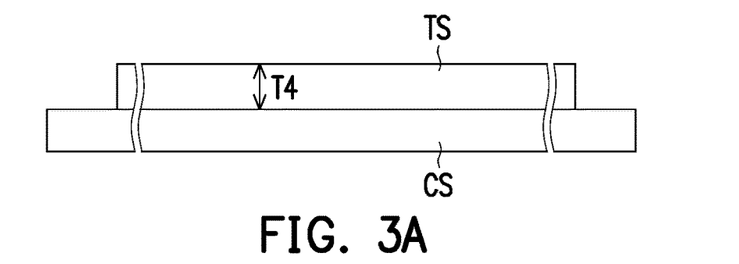
FIG. 3A to FIG. 3G are cross-sectional schematic views of a manufacturing method of a stretchable display panel according to an embodiment of the disclosure.

Referring to FIG. 3A, a temporary substrate TS is formed on a carrier CS. The carrier CS is, for example, a glass carrier, a semiconductor carrier, a metal carrier, or other suitable carriers. In some embodiments, the material of the temporary substrate TS may include polyimide (PI), polyethylene naphthalate (PEN), polyethylene terephthalate (PET), polycarbonates (PC), polyether sulfone (PES), or polyarylate, other suitable materials, or a combination of at least two of the above-mentioned materials, but the disclosure is not limited thereto. In some embodiments, a thickness T4 of the temporary substrate TS is 5 μm to 50 μm.

Figure 3B:
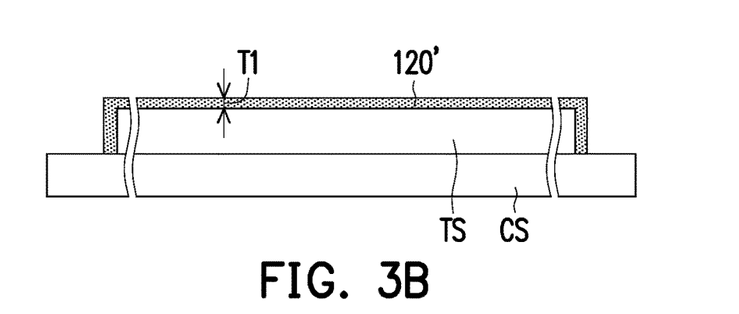

Referring to FIG. 3B, an organic layer 120' is formed on the temporary substrate TS. The material of the organic layer 120' includes polyimide, polyethylene naphthalate, polyethylene terephthalate, polycarbonate, polyether sulfone, or polyarylate, or a combination thereof, or other suitable materials. In some embodiments, the organic layer 120' and the temporary substrate TS may include materials that can withstand the temperature of a thin film transistor manufacturing process. In some embodiments, the thickness T1 of the organic layer 120' is 0.5 μm to 10 μm.

In some embodiments, the organic layer 120' and the temporary substrate TS include the same organic material (for example, both include polyimide). Nevertheless, different elements, different groups, or different dopants may be added to the organic material to provide the organic layer 120' and the temporary substrate TS with different properties. For example, the organic layer 120' and the temporary substrate TS have different etch rates. In other embodiments, the organic layer 120' and the temporary substrate TS include different organic materials.

Figure 3C:
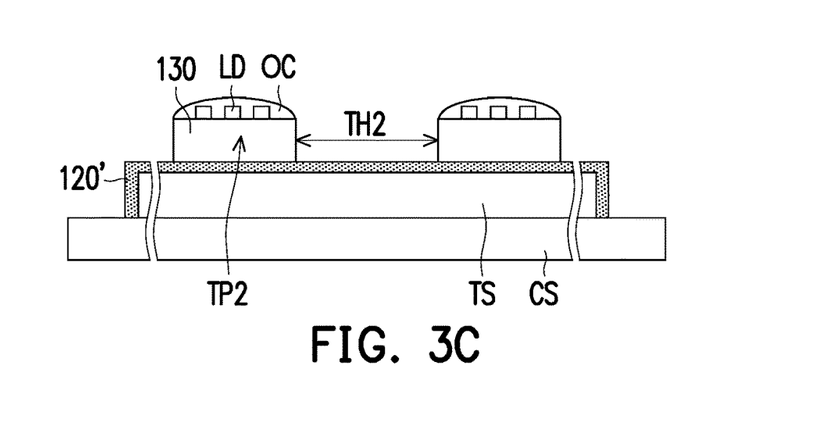

Referring to FIG. 3C, the patterned insulating structure 130, the light-emitting element LD, the cover layer OC, and wires (not shown) are formed on the organic layer 120'. The patterned insulating structure 130 includes the second bridge portion (not shown) and the second island portion TP2.

Figure 3D:
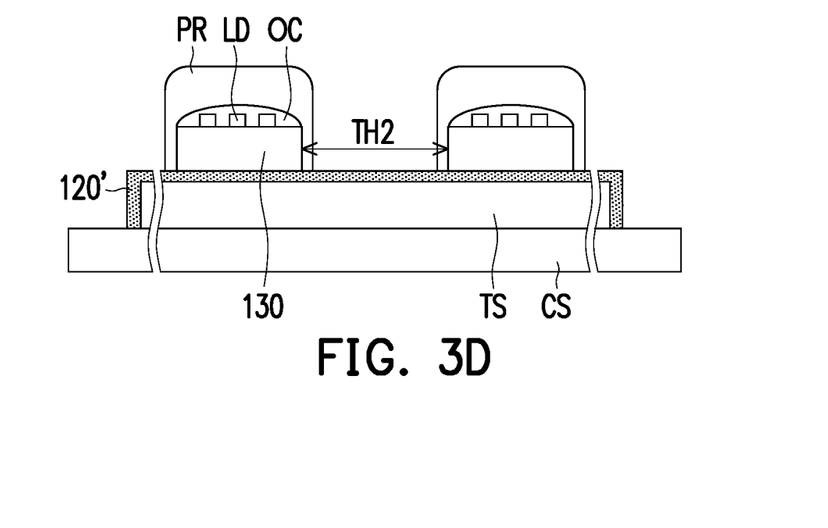

Referring to FIG. 3D, a patterned mask layer PR is formed on the organic layer 120'. The patterned mask layer PR is, for example, a photoresist, and the patterned mask layer PR covers the patterned insulating structure 130, the light-emitting element LD, the cover layer OC, and the wires (not shown). In this embodiment, the patterned mask layer PR optionally envelops the side surfaces of the patterned insulating structure 130. In other words, the patterned mask layer PR optionally fills the through hole TH2 of the patterned insulating structure 130. However, the patterned mask layer PR exposes a portion of the organic layer 120' at the bottom of the through hole TH2.

Figure 3E:
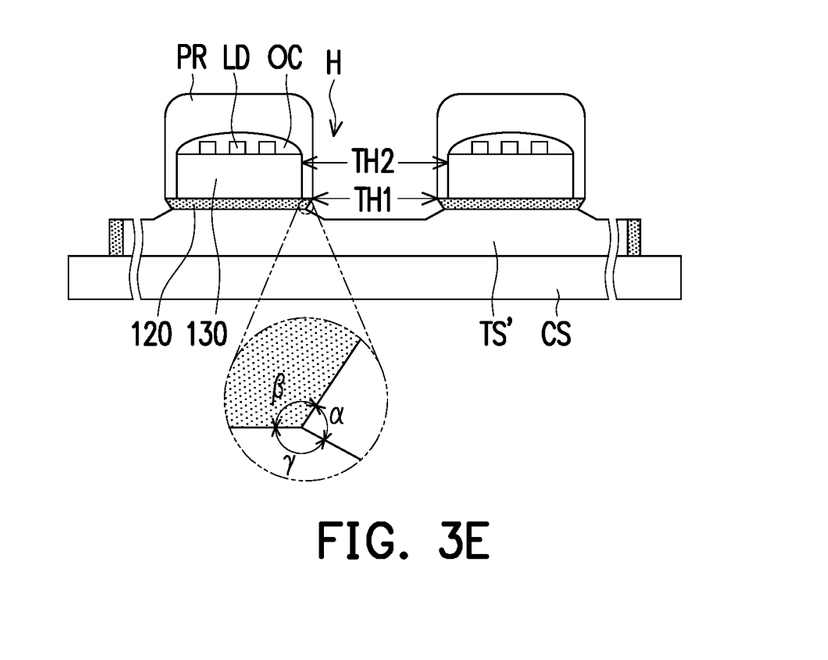

Referring to FIG. 3E, an etching process is performed with the patterned mask layer PR as a mask to remove a portion of the organic layer 120' and the temporary substrate TS and obtain the patterned organic layer 120 and a temporary substrate TS'. The patterned organic layer 120 includes multiple through holes TH1.

In some embodiments, the etching process includes dry etching or wet etching, such as plasma etching. In some embodiments, the gas used for plasma etching includes $O_2$, Ar, $CF_4$, $SF_6$, or other suitable gases. In some embodiments, the etch rate of the organic layer 120' in the etching process is higher than the etch rate of the temporary substrate TS, so an included angle is present at a junction between the patterned organic layer 120 and the temporary substrate TS'. Specifically, a cavity H formed by etching includes the through hole TH1 of the patterned organic layer 120 and the opening of the temporary substrate TS' overlapping the through hole TH1. On a sidewall of the cavity H, an included angle α is present between a side surface of the patterned organic layer 120 and a side surface of the temporary substrate TS'. Therefore, an included angle β between the side surface and a bottom surface of the patterned organic layer 120 is greater than 90 degrees. The included angle β is the included angle θ1 of FIG. 2A or the included angle θ2 of FIG. 2B. Meanwhile, an included angle γ between the side surface and a top surface of the temporary substrate TS' is greater than 90 degrees.

Figure 3F:
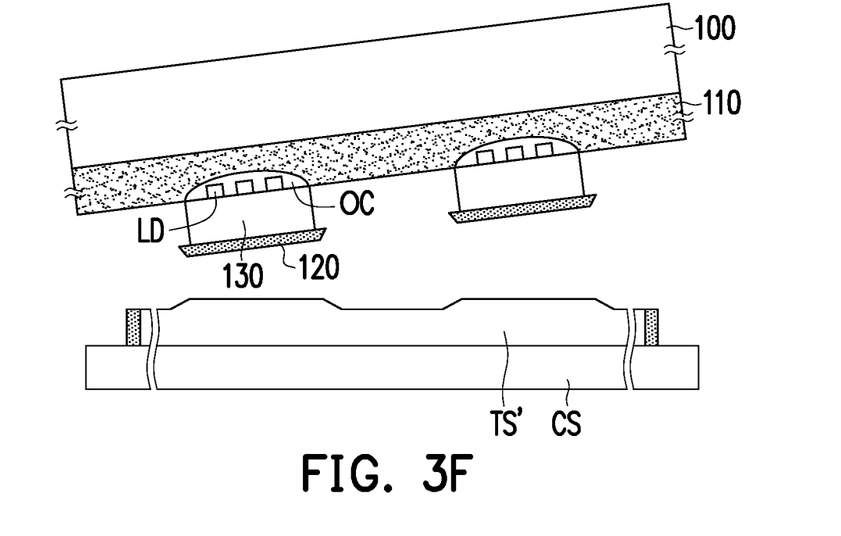

Referring to FIG. 3F, the first stretchable film 100 and the first transparent optical clear adhesive 110 are bonded to the cover layer OC and selectively bonded to the patterned insulating structure 130. The structure on the temporary substrate TS' is peeled off from the top surface of the temporary substrate TS' by bonding the first stretchable film 100 and the first transparent optical clear adhesive 110 to the cover layer OC. In this embodiment, since the included angle β between the side surface and the bottom surface of the patterned organic layer 120 is greater than 90 degrees, the patterned organic layer 120 can be easily peeled off from the top surface of the temporary substrate TS'. In this embodiment, the first transparent optical clear adhesive 110 does not fill into the through hole TH1 and the through hole TH2, but the disclosure is not limited thereto. In other embodiments, the first transparent optical clear adhesive 110 is filled into the through hole TH1 and the through hole TH2.

In this embodiment, the carrier CS can be removed without a laser lift off process. Therefore, the manufacturing cost is reduced. In addition, the thickness of the patterned organic layer 120 is smaller than the thickness of the temporary substrate TS'. Therefore, the overall thickness of the device is reduced by removing the temporary substrate TS'.

Figure 3G:
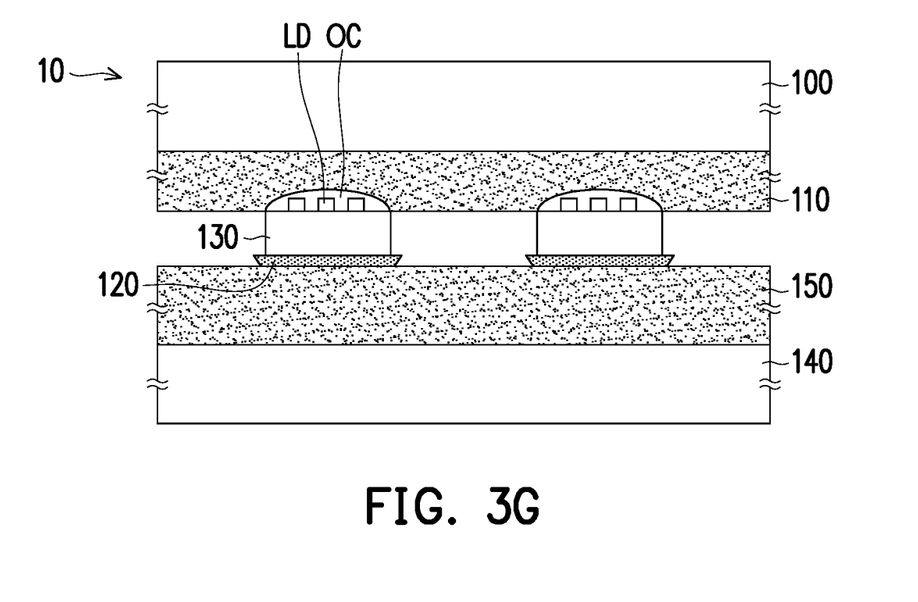

Referring to FIG. 3G, the second stretchable film 140 and the second transparent optical clear adhesive 150 are bonded to the patterned organic layer 120. Accordingly, the stretchable display panel 10 is substantially completed.

Figure 4:
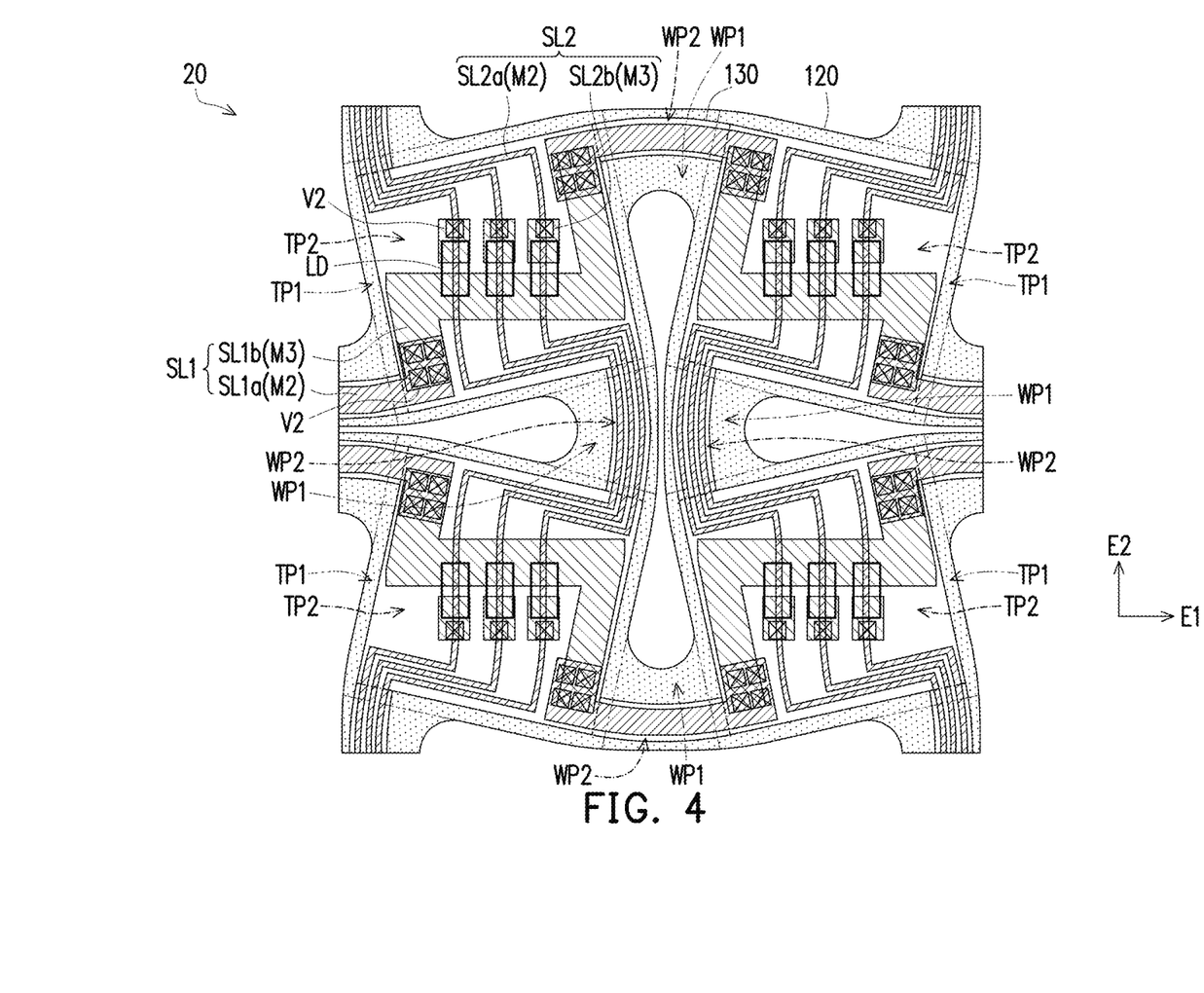
FIG. 4 is a top schematic view of a stretchable display panel according to an embodiment of the disclosure.

FIG. 4 is a top schematic view of a stretchable display panel according to an embodiment of the disclosure. FIG. 4 illustrates the patterned organic layer 120, the patterned insulating structure 130, the second conductive layer M2, the third conductive layer M3, and the light-emitting element LD, whereas other components are omitted. The element reference numerals and a portion of the contents of the embodiments of FIG. 1A, FIG. 2A, and FIG. 2B are used in the embodiment of FIG. 4, the same or similar reference numerals are used to denote the same or similar elements, and the description of the same technical content is omitted. For the description of the omitted portion, reference may be made to the above embodiment, and details are not described herein.

Referring to FIG. 4, a stretchable display panel 20 includes a first stretchable film (omitted and not shown in FIG. 4), a first transparent optical clear adhesive (omitted and not shown in FIG. 4), the patterned organic layer 120, the patterned insulating structure 130, multiple light-emitting elements LD, and multiple wires. In this embodiment, the second conductive layer M2 and the third conductive layer M3 include wires. In this embodiment, the wires include multiple first wires SL1 and multiple second wires SL2.

The multiple first wires SL1 extend along the first direction E1 and are electrically connected to the light-emitting elements LD on the second island portions TP2 arranged in the first direction E1. For example, in this embodiment, the first wire SL1 includes a transmission portion SL1a belonging to the second conductive layer M2 and a connection portion SL1b belonging to the third conductive layer M3. The transmission portion SL1a is located in the second bridge portion WP2 of the patterned insulating structure 130 and extends into the second island portion TP2 of the patterned insulating structure 130. The connection portion SL1b is located in the second island portion TP2 of the patterned insulating structure 130, and is electrically connected to the transmission portion SL1a through the conductive via V2.

In some embodiments, at least three corresponding light-emitting elements LD on each of the second island portions TP2 are electrically connected to the same, corresponding first wire SL1. For example, the third insulating layer has three openings (omitted in FIG. 4) overlapping the connection portion SL1b, three electrodes (omitted in FIG. 4) are respectively formed in the three openings. The three light-emitting elements LD are electrically connected to the connection portion SL1b through the three electrodes The first wire SL1 is, for example, suitable for transmitting a ground voltage signal or a common voltage signal.

The multiple second wires SL2 extend along the second direction E2 and are electrically connected to the light-emitting elements LD on the second island portions TP2 arranged in the second direction E2. For example, in this embodiment, the second wire SL2 includes a transmission portion SL2a belonging to the second conductive layer M2 and a connection portion SL2b belonging to the third conductive layer M3. The transmission portion SL2a is located in the second bridge portion WP2 of the patterned insulating structure 130 and extends into the second island portion TP2 of the patterned insulating structure 130. The connection portion SL2b is located in the second island portion TP2 of the patterned insulating structure 130, and is electrically connected to the transmission portion SL2a through the conductive via V2. In this embodiment, the width of the first wire SL1 is greater than the width of the second wire SL2.

In some embodiments, at least three corresponding light-emitting elements LD on each of the second island portions TP2 are respectively electrically connected to at least three corresponding second wires SL2. For example, the third insulating layer has three openings (omitted in FIG. 4) overlapping the connection portion SL2b, and three electrodes (omitted in FIG. 4) are respectively formed in the three openings. The three light-emitting elements LD are electrically connected to the connection portion SL2b through the three electrodes.

It should be noted that the stretchable display panel 20 of FIG. 4 is a passive display device, and no active elements are disposed in the patterned insulating structure 130. However, the disclosure is not limited thereto. In other embodiments, active elements may be disposed in the patterned insulating structure of the stretchable display panel, and the stretchable display panel is an active display device.

Figure 5:
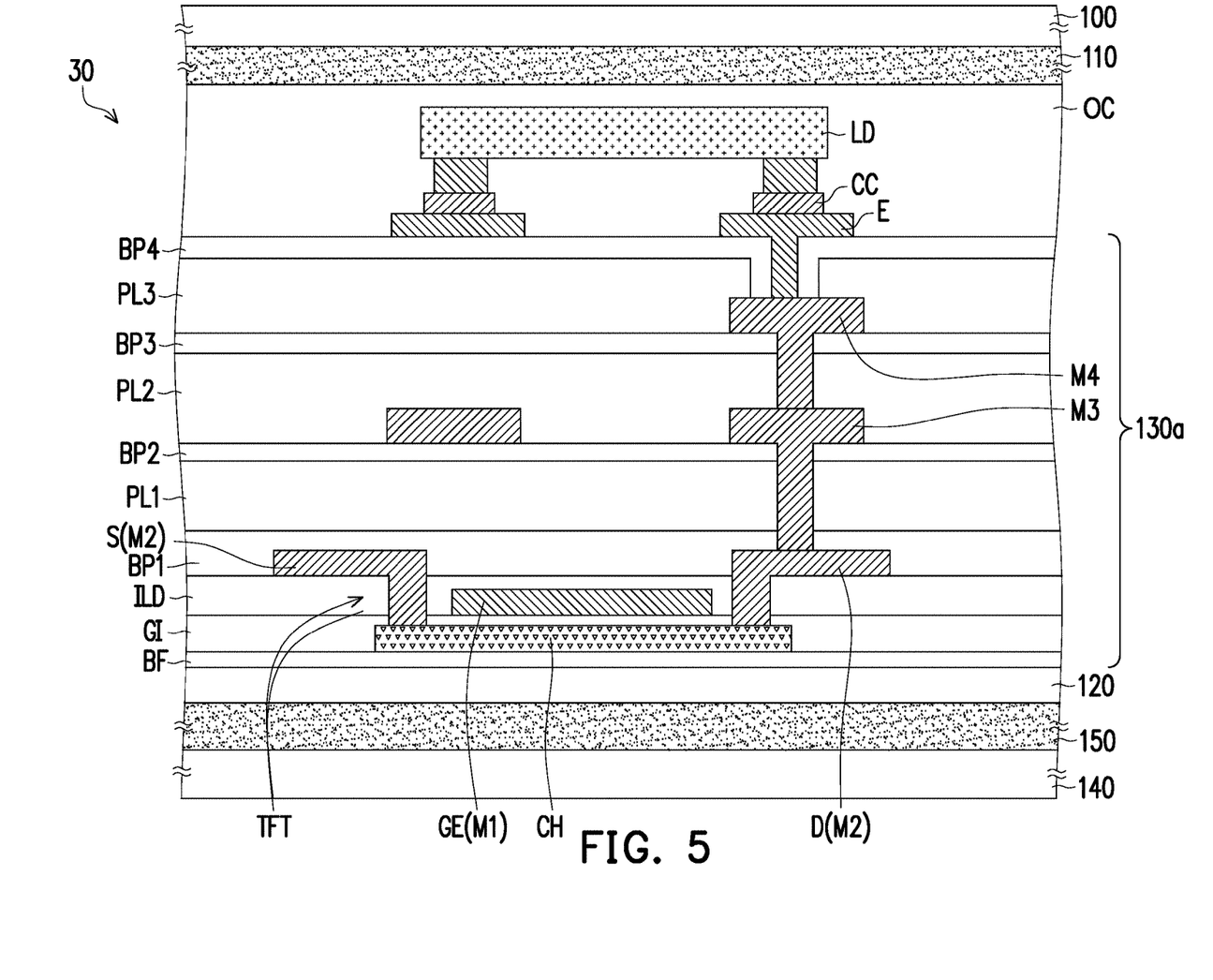
FIG. 5 is a cross-sectional schematic view of a stretchable display panel according to an embodiment of the disclosure.

FIG. 5 is a cross-sectional schematic view of a stretchable substrate according to an embodiment of the disclosure. The element reference numerals and a portion of the contents of the embodiments of FIG. 1A, FIG. 2A, and FIG. 2B are used in the embodiment of FIG. 5, the same or similar reference numerals are used to denote the same or similar elements, and the description of the same technical content is omitted. For the description of the omitted portion, reference may be made to the above embodiment, and details are not described herein.

Referring to FIG. 5, in this embodiment, a stretchable display panel 30 further includes an active element TFT. The active element TFT is located in a patterned insulating structure 130a and is electrically connected to the light-emitting element LD.

In this embodiment, the patterned insulating structure 130a includes a barrier layer BF, a gate insulating layer GI, an interlayer dielectric layer ILD, the first insulating layer PL1, the second insulating layer PL2, and the third insulating layer PL3. In this embodiment, the patterned insulating structure 130a optionally includes the first buffer layer BP1, the second buffer layer BP2, the third buffer layer BP3, and a fourth buffer layer BP4.

In some embodiments, the barrier layer BF, the gate insulating layer GI, the interlayer dielectric layer ILD, the first buffer layer BP1, the first insulating layer PL1, the second buffer layer BP2, the second insulating layer PL2, the third buffer layer BP3, the third insulating layer PL3, and the fourth buffer layer BP4 include an organic or inorganic insulating material. In some embodiments, the respective thicknesses of the first insulating layer PL1, the second insulating layer PL2 and the third insulating layer PL3 are, for example, 1 µm to 5 µm, and the respective thicknesses of the first buffer layer BP1, the second buffer layer BP2, the third buffer layer BP3, and the fourth buffer layer BP4 are, for example, 100 Å to 10,000 Å, but the disclosure is not limited thereto. In some embodiments, the total thickness of the barrier layer BF, the gate insulating layer GI, and the interlayer dielectric layer ILD is 0.5 µm to 5 µm, such as about 1.8 µm, but the disclosure is not limited thereto.

The barrier layer BF is located on the patterned organic layer 120. A semiconductor channel layer CH is located on the barrier layer BF. The gate insulating layer GI is located on the semiconductor channel layer CH. A gate GE in the first conductive layer M1 is located on the gate insulating layer GI and overlapped with the semiconductor channel layer CH. The interlayer dielectric layer ILD is located on the first conductive layer M1 and the gate insulating layer GI. A drain D and a source S of the second conductive layer M2 are located on the interlayer dielectric layer ILD, and are electrically connected to the semiconductor channel layer CH. In this embodiment, the active element TFT includes the gate G, the semiconductor channel layer CH, the drain D, and the source S. In this embodiment, the active element TFT is a top gate type thin film transistor, but the disclosure is not limited thereto. In other embodiments, the active element TFT is a bottom gate type thin film transistor or other types of thin film transistors.

The first buffer layer BP1, the first insulating layer PL1 and the second buffer layer BP2 are located on the second conductive layer M2, and the interlayer dielectric layer ILD. The third conductive layer M3 is located on the second buffer layer BP2, and at least a portion of the third conductive layer M3 is electrically connected to the active element TFT. The second insulating layer PL2 and the third buffer layer BP3 are located on the third conductive layer M3 and the second buffer layer BP2. The fourth conductive layer M4 is located on the third buffer layer BP3, and at least a portion of the fourth conductive layer M4 is electrically connected to the third conductive layer M3. The third insulating layer PL3 and the fourth buffer layer BP4 are located on the fourth conductive layer M4. The electrode E is located on the fourth buffer layer BP4, and at least a portion of the electrode E is electrically connected to the active element TFT through the fourth conductive layer M4 and the third conductive layer M3. The light-emitting element LD is electrically connected to the electrode E through the conductive connection structure CC. In some embodiments, the conductive connection structure CC includes, for example, indium, tin, bismuth, conductive paste, a combination thereof, or other suitable materials.

The cover layer OC is located on the light-emitting element LD. The first stretchable film 100 is bonded to the cover layer OC through the first transparent optical clear adhesive 110. In some embodiments, the first stretchable film 100 is further bonded to the patterned insulating structure 130a through the first transparent optical clear adhesive 110. The second stretchable film 140 is bonded to the patterned organic layer 120 through the second transparent optical clear adhesive 150.

To sum up, in the stretchable display panel of the embodiments of the disclosure, with the included angle in the patterned organic layer being greater than 90 degrees, the patterned organic layer can be easily peeled off from the temporary substrate. Accordingly, the manufacturing cost as well as the overall device thickness can be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A stretchable display panel, comprising:
a first stretchable film;
a first transparent optical clear adhesive, located on the first stretchable film;
a patterned organic layer, comprising:
   a plurality of first island portions; and
   a plurality of first bridge portions, wherein each of the first bridge portions connects corresponding two of the first island portions;
a patterned insulating structure, located on the patterned organic layer, and comprising a plurality of cured photoresist layers, wherein the patterned insulating structure comprises:
   a plurality of second island portions, located on the first island portions; and
   a plurality of second bridge portions, located on the first bridge portions, wherein each of the second bridge portions connects corresponding two of the second island portions;
a plurality of light-emitting elements, located above the second bridge portions, wherein the first transparent optical clear adhesive is located between the light-emitting elements and the first stretchable film, a first surface of the patterned organic layer faces away from the light-emitting elements, and an included angle between the first surface and a first side surface of the first island portions is greater than 90 degrees; and a plurality of wires, located above the first bridge portions.

2. The stretchable display panel according to claim 1, further comprising:
   a second stretchable film; and
   a second transparent optical clear adhesive, located on the second stretchable film, and contacting the first surface of the patterned organic layer.

3. The stretchable display panel according to claim 2, wherein the first stretchable film and the second stretchable film do not have holes.

4. The stretchable display panel according to claim 1, further comprising:
   a plurality of cover layers, enveloping the light-emitting elements, wherein the first transparent optical clear adhesive contacts the cover layers.

5. The stretchable display panel according to claim 1, wherein the patterned organic layer comprises polyimide, polyethylene naphthalate, polyethylene terephthalate, polycarbonates, polyether sulfone, or polyarylate, or a combination thereof.

6. The stretchable display panel according to claim 1, wherein a width of the second bridge portions is smaller than a width of the first bridge portions.

7. The stretchable display panel according to claim 1, further comprising:
   a plurality of active elements, located in the second island portions, wherein the wires are located in the second bridge portions.

8. The stretchable display panel according to claim 1, wherein each of the second island portions further comprises at least one inorganic insulating layer, and the at least one insulating layer does not extend into the second bridge portions.

9. The stretchable display panel according to claim 1, wherein a thickness of the second bridge portions is smaller than a thickness of the second island portions.

10. The stretchable display panel according to claim 1, wherein each of the second bridge portions is located on a corresponding first bridge portion of the first bridge portions, and a side surface of each of the second bridge portions deviates from a side surface of the corresponding first bridge portion of the first bridge portions.

11. The stretchable display panel according to claim 1, wherein an area of a bottom surface of the patterned insulating structure contacting the patterned organic layer is smaller than an area of a second surface of the patterned organic layer facing toward the patterned insulating structure.

12. The stretchable display panel according to claim 1, wherein one or more of the wires directly contact the patterned organic layer.

13. The stretchable display panel according to claim 1, wherein a thickness of the patterned organic layer is 0.5 μm to 10 μm.

14. The stretchable display panel according to claim 1, wherein a thickness of the first stretchable film is 50 μm to 1000 μm.

15. The stretchable display panel according to claim 1, wherein an included angle between the first surface of the patterned organic layer and a second side surface of the first bridge portions is greater than 90 degrees.

16. The stretchable display panel according to claim 1, wherein an area of a second surface of the patterned organic layer close to the light-emitting elements is larger than an area of the first surface.

17. The stretchable display panel according to claim 1, wherein the patterned organic layer has a plurality of through holes, each of the through holes is surrounded by corresponding four first island portions of the first island portions and corresponding four first bridge portions of the first bridge portions, and the first stretchable film overlaps the through holes.

18. The stretchable display panel according to claim 1, wherein a material of the first stretchable film comprises a thermoplastic polymer.

\* \* \* \* \*